United States Patent
Krivokapic et al.

(10) Patent No.: US 6,727,546 B2
(45) Date of Patent: Apr. 27, 2004

(54) SELF-ALIGNED TRIPLE GATE SILICON-ON-INSULATOR (SOI) DEVICE

(75) Inventors: Zoran Krivokapic, Santa Clara, CA (US); Matthew Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/379,239

(22) Filed: Mar. 3, 2003

(65) Prior Publication Data

US 2003/0136963 A1 Jul. 24, 2003

Related U.S. Application Data

(62) Division of application No. 09/711,445, filed on Nov. 13, 2000.

(51) Int. Cl.[7] .................................................. H01L 29/76
(52) U.S. Cl. ..................... 257/331; 257/347; 257/365; 257/369
(58) Field of Search ................ 257/331, 347, 257/365, 369

(56) References Cited

U.S. PATENT DOCUMENTS

| | | | | |
|---|---|---|---|---|
| 5,315,143 A | * | 5/1994 | Tsuji | 257/351 |
| 5,461,250 A | * | 10/1995 | Burghartz et al. | 257/347 |
| 5,583,059 A | * | 12/1996 | Burghartz | 438/319 |
| 5,679,970 A | * | 10/1997 | Hartmann | 257/320 |
| 5,917,210 A | * | 6/1999 | Huang et al. | 257/292 |
| 6,387,739 B1 | * | 5/2002 | Smith, III | 438/157 |
| 6,396,108 B1 | * | 5/2002 | Krivokapic et al. | 257/365 |
| 6,548,870 B1 | * | 4/2003 | Lee | 257/365 |
| 6,580,129 B2 | * | 6/2003 | Lui et al. | 257/347 |
| 6,617,636 B2 | * | 9/2003 | Tuan et al. | 257/315 |

* cited by examiner

Primary Examiner—T. N. Quach
(74) Attorney, Agent, or Firm—Fliesler Meyer LLP

(57) ABSTRACT

A self-aligned transistor including a first silicon portion on an isolation layer, the silicon portion having formed therein a source region and a drain region separated by a channel region. The channel region has a first side and a second side and a top portion, and a gate oxide surrounds the channel on said first side, second side and top portion. A first, a second and a third silicon gate regions are positioned in a second silicon portion surrounding the first silicon portion about the first side, second side and top portion and the channel region. Also disclosed is a method for manufacturing a transistor device. The method for manufacturing includes the steps of: providing a substrate having a buried oxide region; depositing a first nitride mask layer having a pattern overlaying a silicon region; forming a trench in said substrate with a depth to said buried oxide; depositing a conformal oxide in said trench; forming vias in said conformal oxide adjacent to said silicon region and removing a portion of said first nitride mask to expose a portion of said silicon region; depositing polysilicon in said vias and on said portion of said silicon region; and implanting an impurity into exposed portions of polysilicon in said trench and of said silicon-on-insulator substrate underlying said second nitride layer.

12 Claims, 10 Drawing Sheets

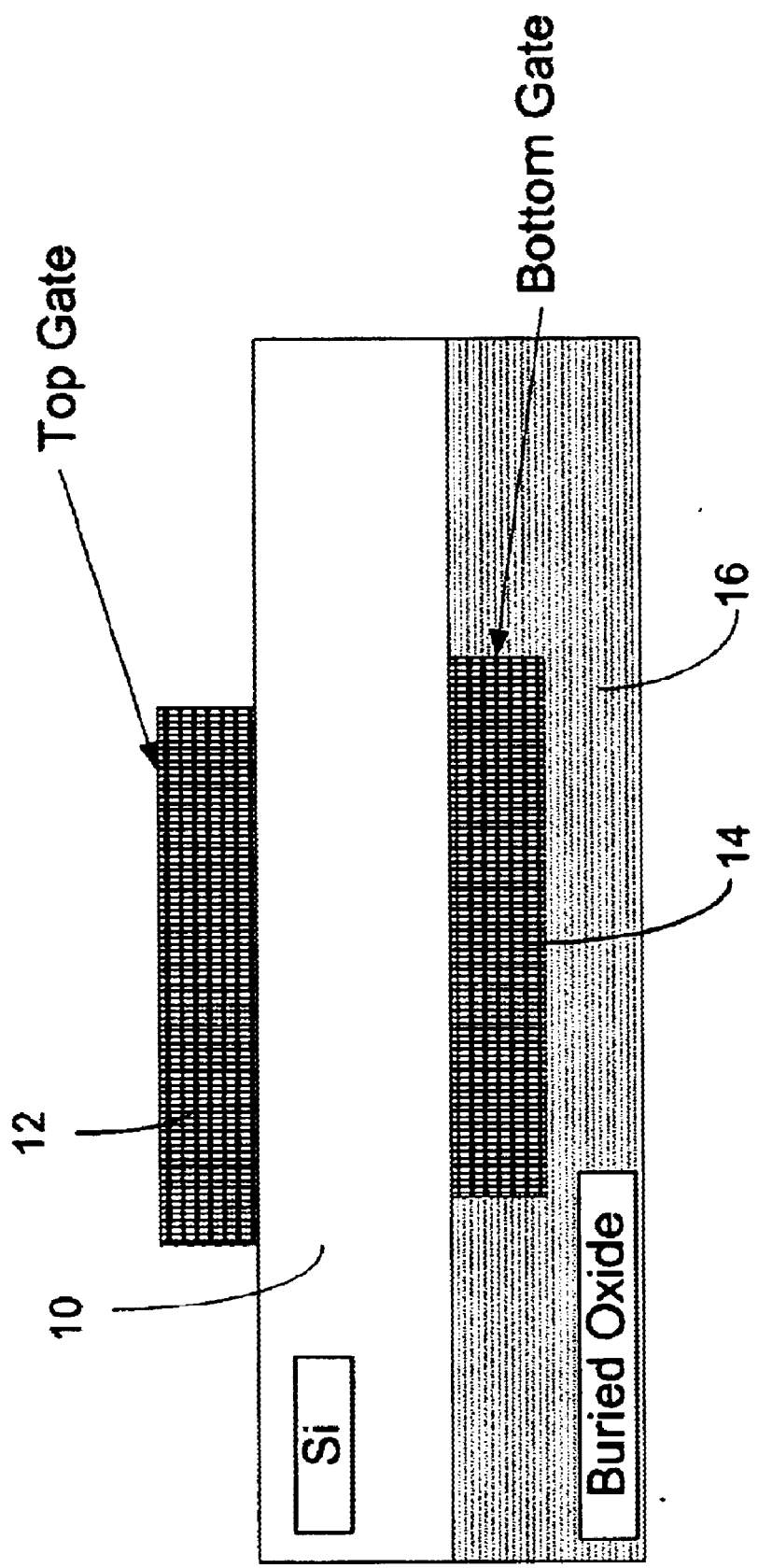
FIG. 1 - Prior Art

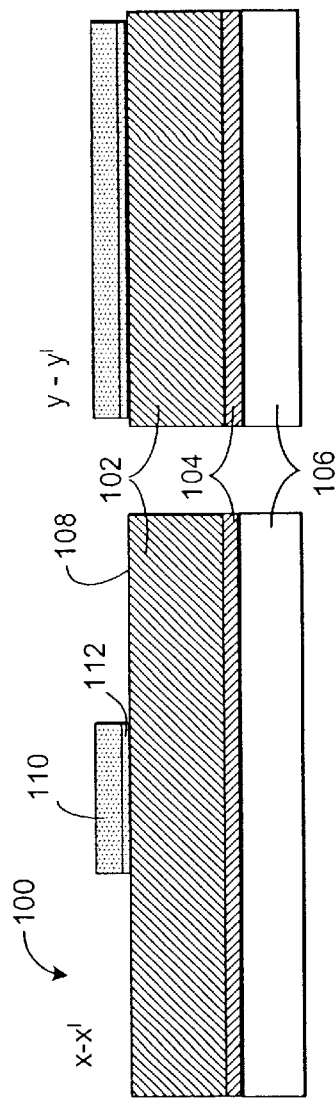
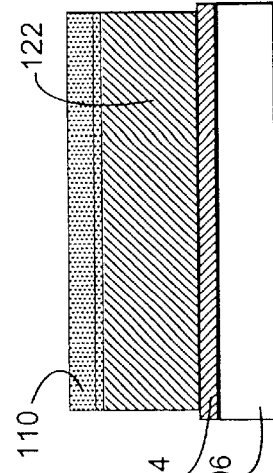
FIG. 2C
FIG. 2B
FIG. 2A
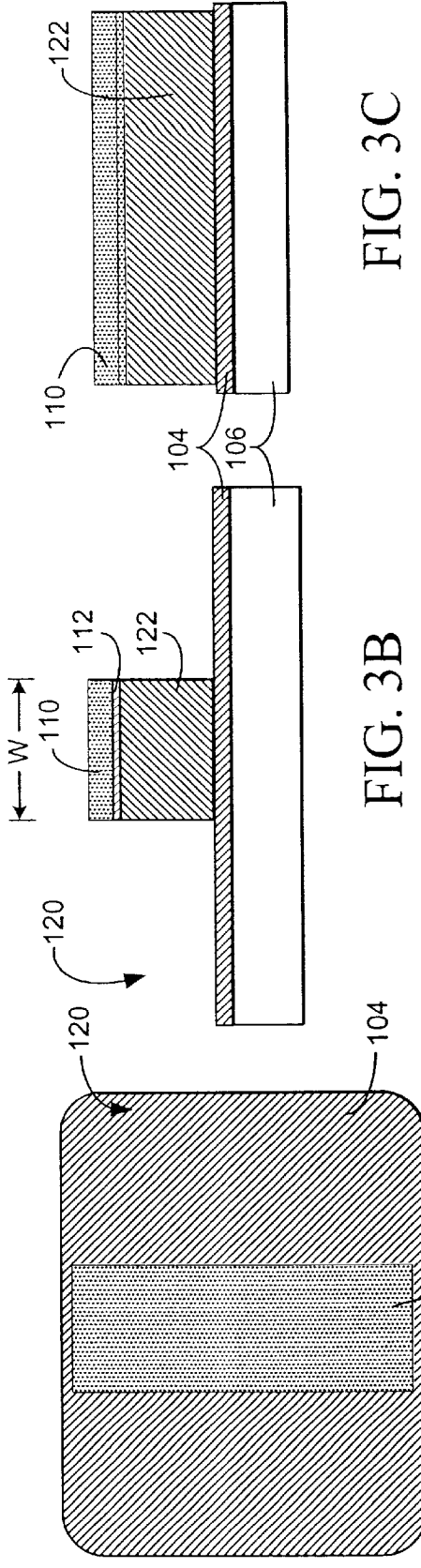
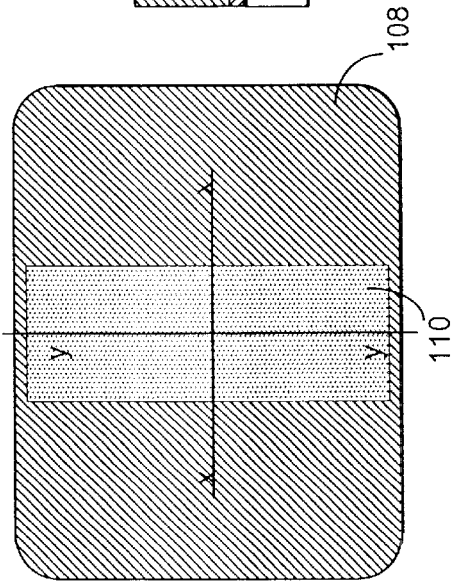
FIG. 3C
FIG. 3B
FIG. 3A

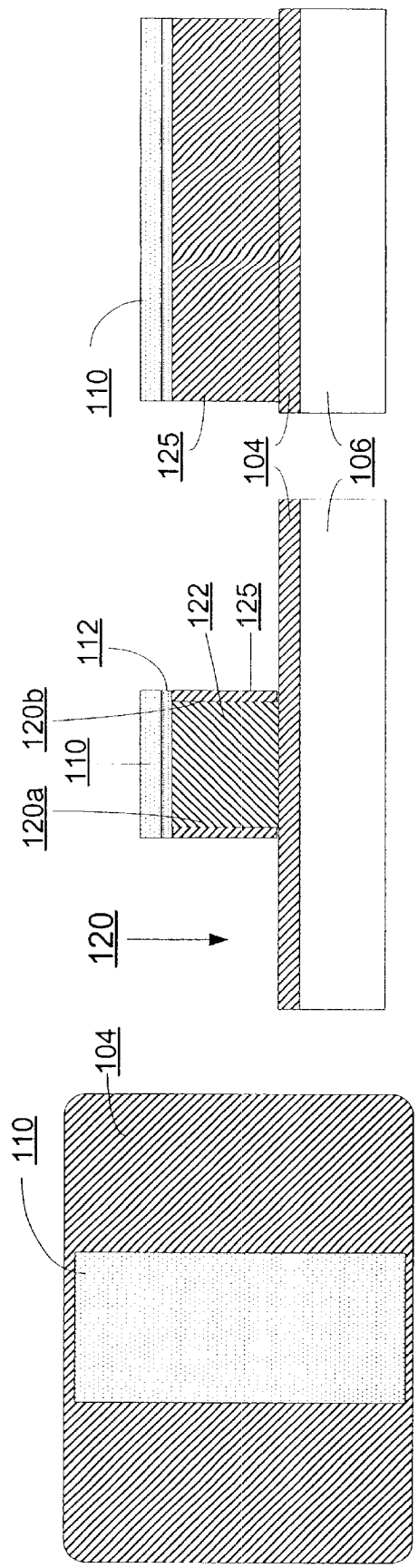

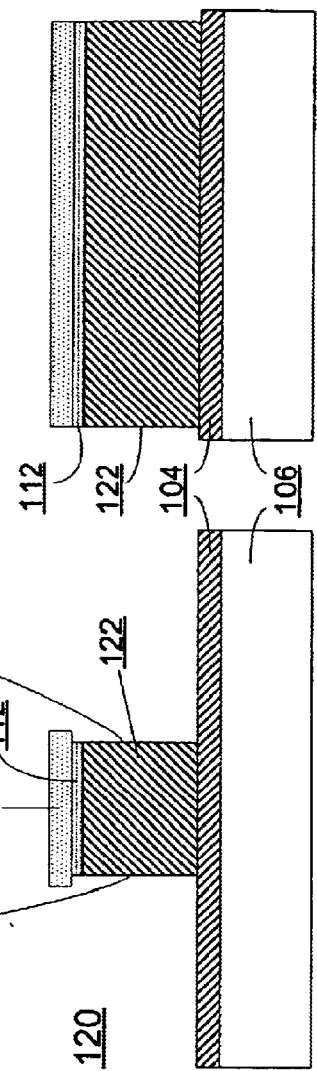

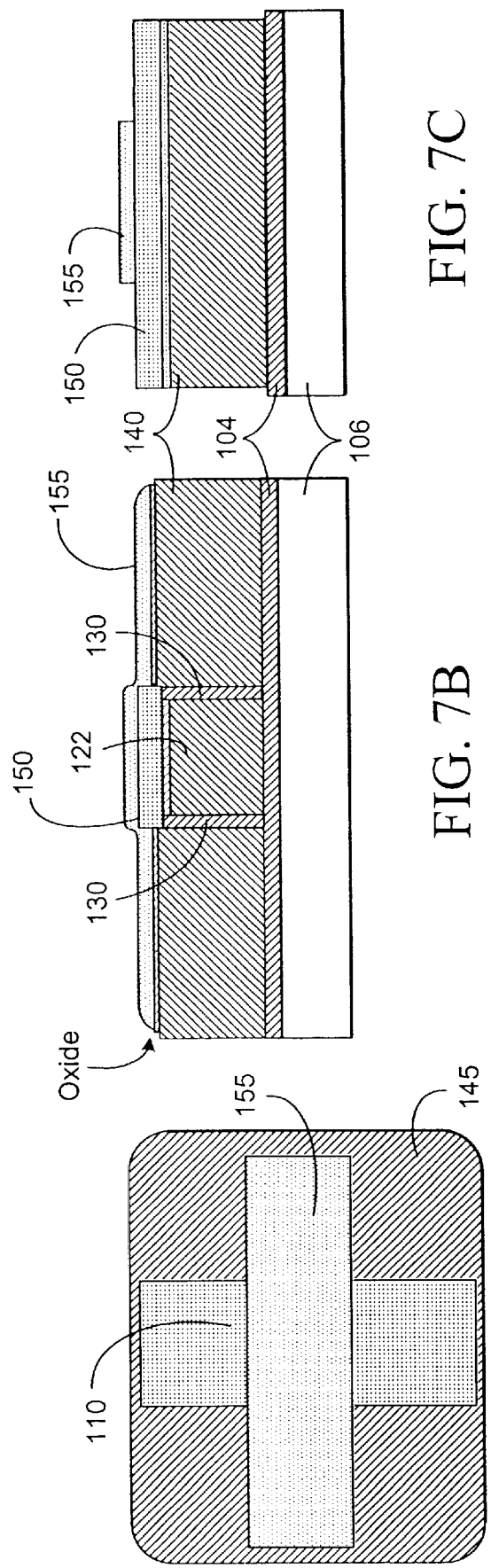

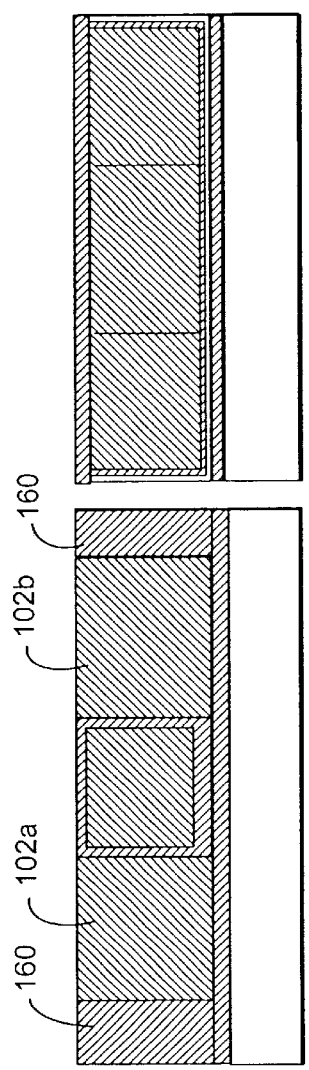
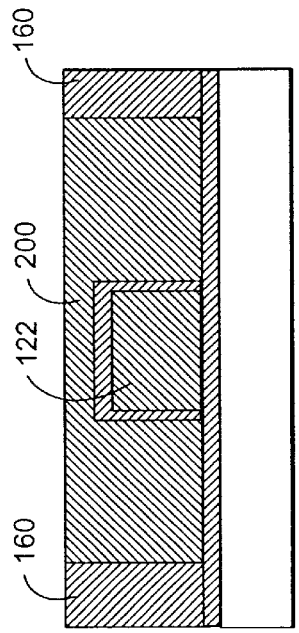
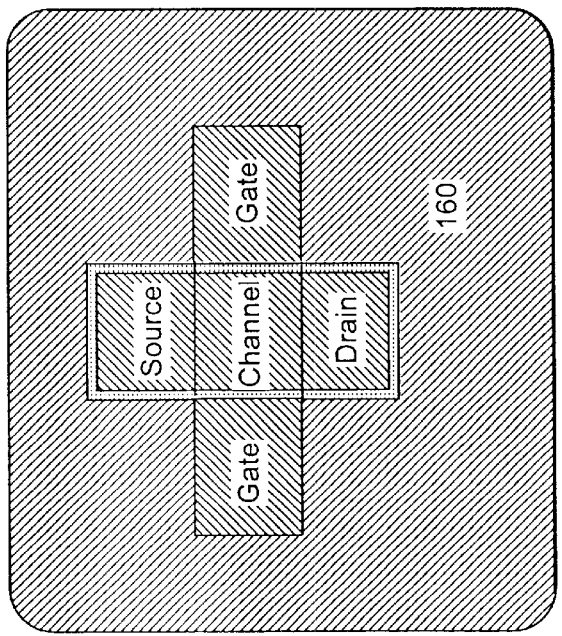
FIG. 10C
FIG. 10B
FIG. 11
FIG. 10A

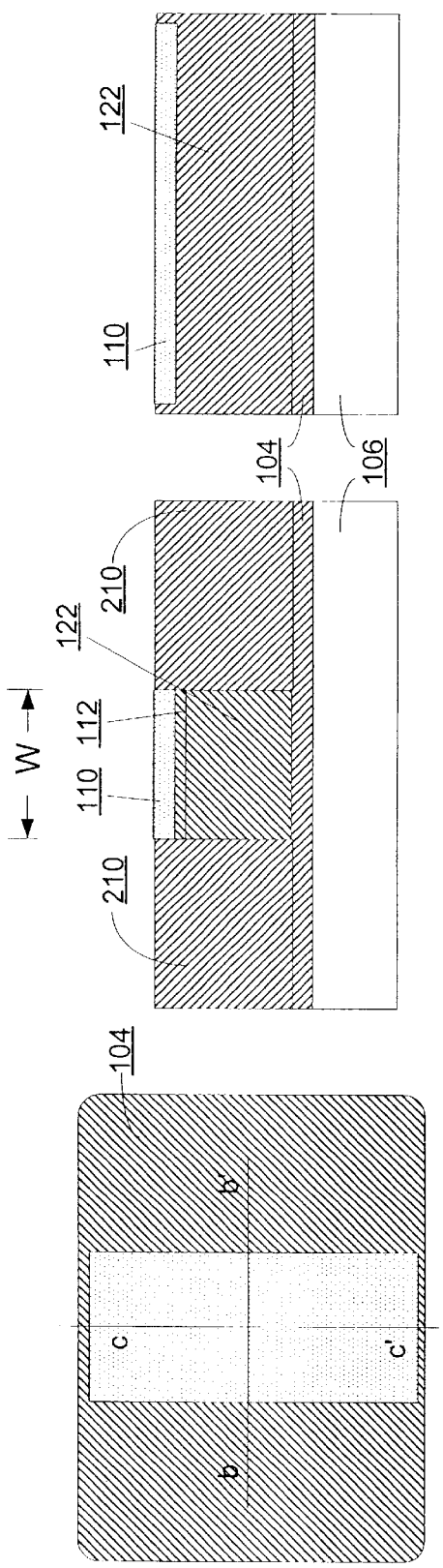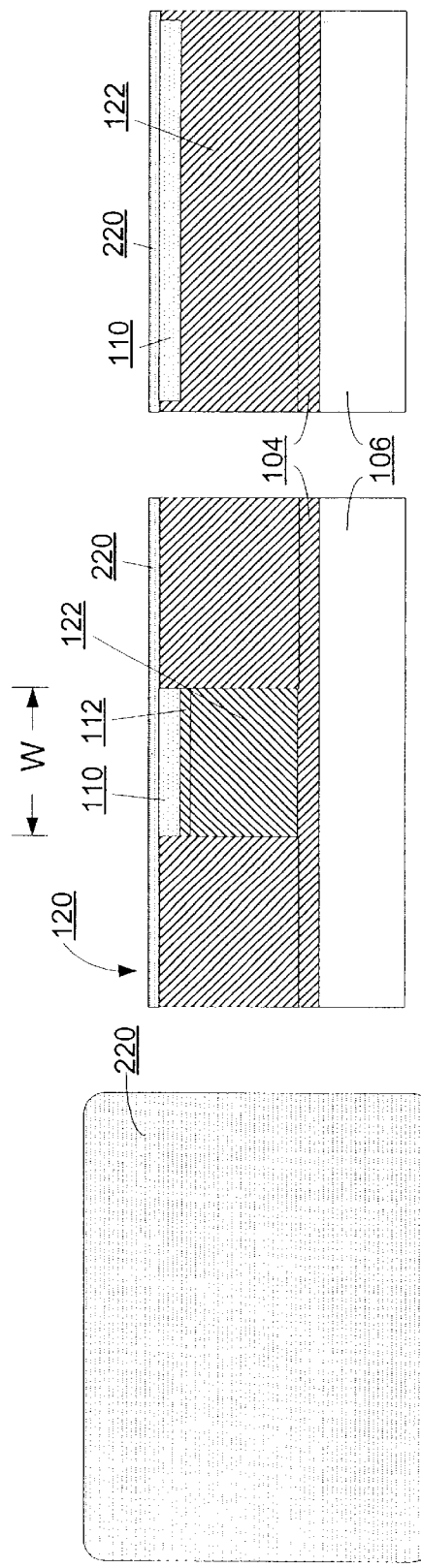

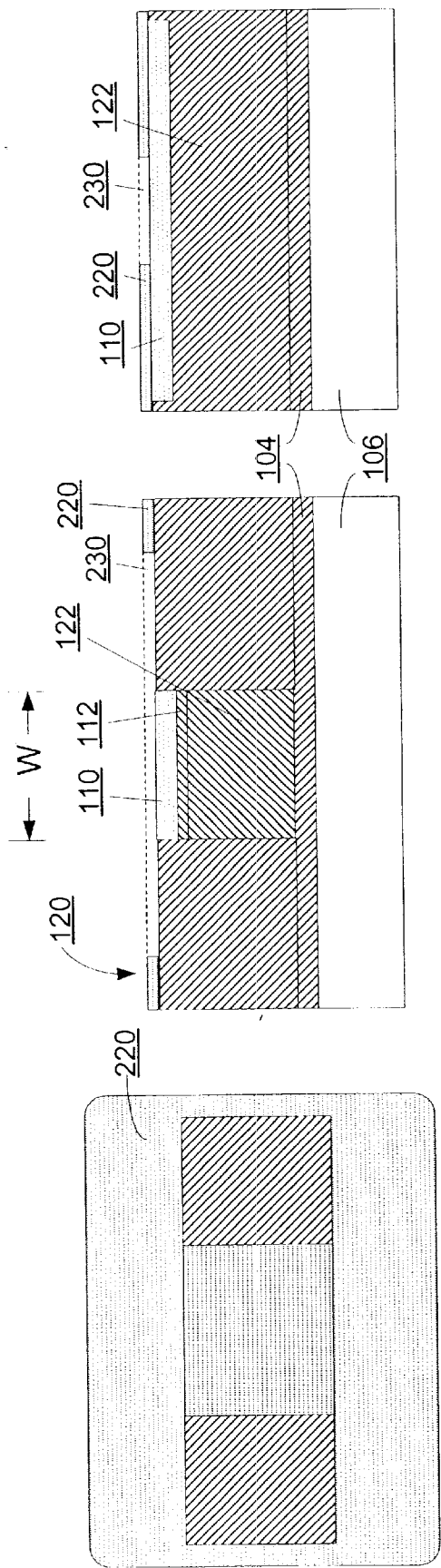

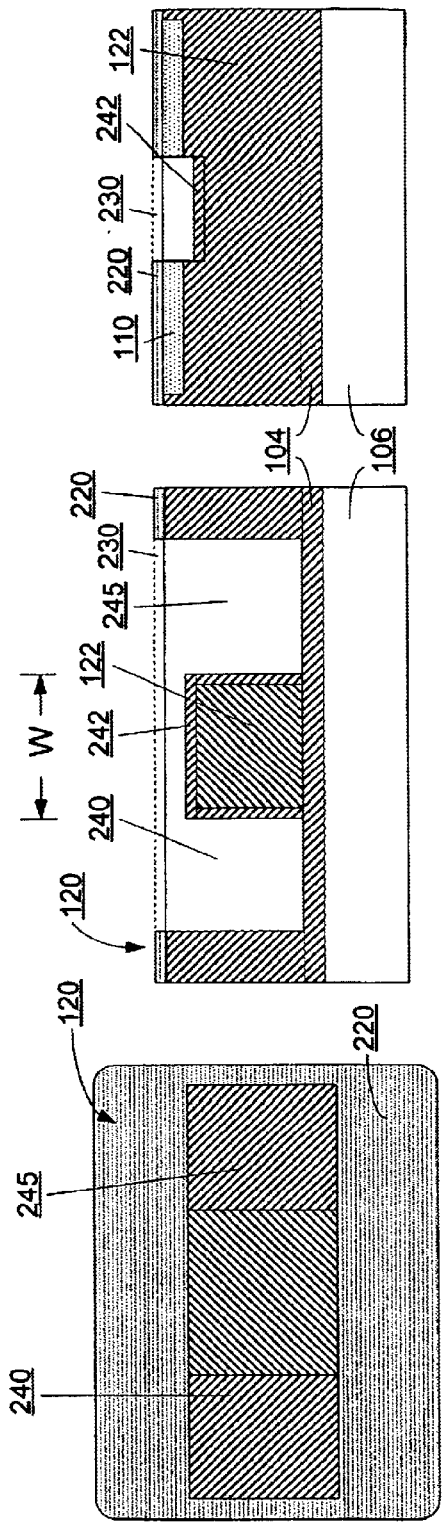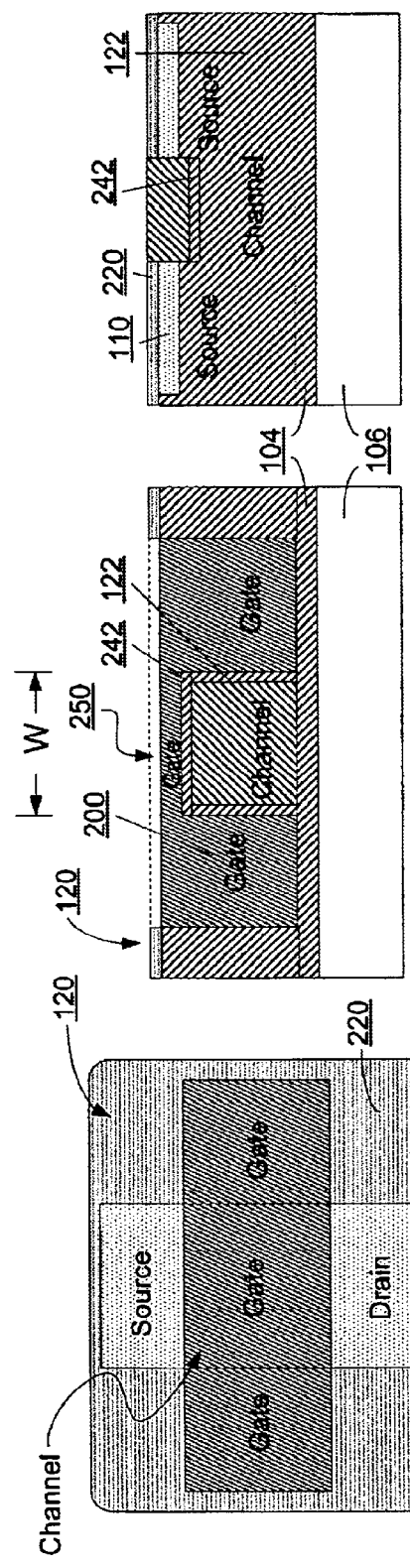

SELF-ALIGNED TRIPLE GATE SILICON-ON-INSULATOR (SOI) DEVICE

This application is a Divisional of Ser. No. 09/711,445, filed Nov. 13, 2000.

BACKGROUND OF THE INVENTION

1. Field of the Invention

The invention relates to a structure and a method for constructing a triple-gate transistor device, particularly a triple-gate transistor.

2. Description of the Related Art

Multiple-gate transistors have a number of different uses. However, construction of vertical multiple-gate devices has always been somewhat difficult, given alignment problems between the gates used in the device.

FIG. 1 shows a cross-sectional view of a double-gate device formed on a silicon substrate 10 having a top gate 12 and a bottom gate 14 formed in a buried oxide layer 16. Construction of gates 12 and 14 in this stacked type of device leads to alignment problems between the vertically separated top and bottom gates 12 and 14, respectively. In addition, care must be taken to provide ample connectivity for gate 14.

Simplification and self-alignment in semiconductor processing methods is constantly advantageous. Hence a method which provides a simplified method for forming a multiple-gate device would be advantageous.

SUMMARY OF THE INVENTION

The invention, roughly described, comprises a self-aligned transistor. The transistor includes a first silicon portion on an isolation layer, the silicon portion having formed therein a source region and a drain region separated by a channel region. The channel region has a first side and a second side and a top portion, and a gate oxide surrounds the channel on said first side, second side and top portion. A first, a second and a third silicon gate regions are positioned in a second silicon portion surrounding the first silicon portion about the first side, second side and top portion and the channel region.

In a further embodiment, the invention comprises a method for manufacturing a transistor device. The method for manufacturing includes the steps of: providing a substrate having a buried oxide region; depositing a first nitride mask layer having a pattern overlying a silicon region; forming a trench in said substrate with a depth to said buried oxide; depositing a conformal oxide in said trench; forming vias in said conformal oxide adjacent to said silicon region and removing a portion of said first nitride mask to expose a portion of said silicon region; depositing polysilicon in said vias and on said portion of said silicon region; and implanting an impurity into exposed portions of polysilicon in said trench and of said silicon-on-insulator substrate underlying said second nitride layer.

BRIEF DESCRIPTION OF THE DRAWINGS

The invention will be described with respect to the particular embodiments thereof. Other objects, features, and advantages of the invention will become apparent with reference to the specification and drawings in which:

FIG. 1 is a cross-section diagram of a stacked gate double-gate device.

FIGS. 2–10 show cross-sections of a first embodiment of a semiconductor device formed in accordance with the present invention at various points in the manufacturing process, wherein:

FIGS. 2A–10A show a plan view of a series of steps utilized in constructing the device;

FIGS. 2B–10B show a first cross-section along lines X–X' (represented in FIG. 2A) in each of the corresponding FIGS. 2A–10A and 2C–10C; and FIGS. 2C–10C show a cross-section along line Y–Y' (represented in FIG. 2A) in corresponding FIGS. 2A–10A and 2C–10C.

FIG. 11 is a cross-section of a second embodiment of the device of the present invention.

FIGS. 12–16 show cross-sections of a second embodiment of a semiconductor device formed in accordance with the present invention at various points in the manufacturing process, wherein:

FIGS. 12A–16A show a plan view of a series of steps used in constructing a second embodiment of the device;

FIGS. 12B–16B show a first cross-section along lines b–b' (represented in FIG. 12A) in each of the corresponding figures 12A–16A and 12C–16C; and FIGS. 12C–16C show a cross-section along line c–c' (represented in FIG. 12A) in corresponding FIGS. 12A–16A and 12C–16C.

DETAILED DESCRIPTION OF THE PREFERRED EMBODIMENTS

Figure 8A:
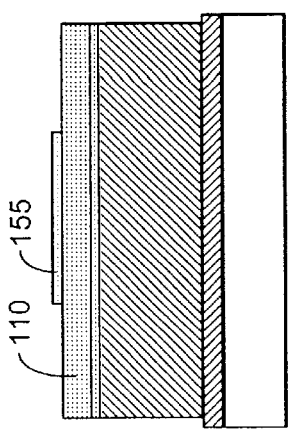

The present invention provides in one embodiment a unique structure for a double-gate transistor device, and specifically a double-gate silicon-on-insulator device. Moreover, a novel method of constructing the device is provided. In an alternative embodiment, a three-sided gate device, and a method for making the device, is disclosed.

It should be recognized that while the devices are described herein with respect to construction as a silicon-on-insulator device, the silicon-on-insulator devices may be formed on any number of methods including bonding a handle wafer to a device wafer, implanting an oxide layer deep within a bulk silicon substrate, or deposited polysilicon on an oxide layer, or any of a number of well-known silicon-on-insulator construction techniques. It should be further recognized that while a silicon-on-insulator substrate is described, other types of substrates including germanium-on-insulator are equally contemplated as being within the scope of the constructed techniques and the structure taught herein.

Each of FIGS. 2–10 shows a plan view (FIGS. 2A–10A), a first cross-section 2B–10B along the perspective X–X' (illustrated in FIG. 2A), and a second cross-section 2C–10C along line Y–Y' (illustrated in FIG. 2A), of the device under construction in accordance with a first embodiment of the method of the present invention. Each FIGS. 2–10 shows the device in that Figure at a single point in time during construction such that, for example, each FIGS. 2A, 2B, 2C are three perspectives at the same point in time.

FIG. 2A is a plan view of a silicon-on-insulator substrate 100 having, for example, a device wafer 102, a buried oxide layer 104, and a handle wafer 106 bonded to the device wafer 102 via oxide 104. The particular method of construction of the silicon-on-insulator substrate is not germane to the scope of the present invention. Nevertheless, for convention, the terms "device layer," "buried oxide" and "handle wafer" will be used without intending to limit the nature of the substrate's construction.

As shown in FIGS. 2B and 2C, initially, an oxide layer 112 having a thickness of about 5–15 nanometers is formed on the surface of substrate 100. Next, a nitride mask layer 110 having a thickness of approximately 100–190 nanometers is deposited on the surface of device substrate 102. Nitride mask layer 110 will be utilized as a mask for a silicon etch performed in device layer 102. Nitride layer 110 may be formed by any number of known processes including, for example, low pressure chemical vapor deposition (LPCVD), which forms a blanket layer of nitride across the surface of the wafer, which is then subsequently patterned to form the nitride mask shape shown in FIG. 2A by applying a resist mask (not shown), patterning the mask, and etching the nitride layer. Nitride layer 110 is formed to a thickness which is sufficient to protect the underlying polysilicon and oxide layers during the subsequent processing described herein. In one embodiment, the first nitride will be twice as thick as a second nitride shown as applied in FIG. 7. In accordance with the invention, the nitride layers are etched twice during silicon processing and must withstand this etching to protect the underlying device areas as discussed below.

As shown in FIGS. 3A–3C, a silicon etch removes selected portions of the device layer 102 down to buried oxide layer 104. The silicon etch may be performed by well-known techniques including reactive ion etching or any directional etch technique, to generate a high aspect ratio trench 120 surrounding silicon 122.

In accordance with the invention, the width W of the silicon 122 as shown in FIG. 3B is defined based on the width W of the nitride layer 110, and the dimensions of the device which are ultimately to be achieved. As will be understood from the following descriptions, the width of the transistor device formed in accordance with the invention will be determined by the vertical thickness of the silicon 122 (e.g. the thickness of device layer 102), the length of the device by the length of a second nitride layer deposited as discussed below with respect to FIG. 7 in the Y–Y' direction, and the width "W" of the nitride 110 which ultimately controls the distance between the first and second gates.

As shown in FIGS. 4A, 4B, 4C, following the trench etch, a sacrificial oxide 125 is provided on silicon 122 to clean the sidewalls 120a, 120b of the silicon 122 so that the subsequent gate oxide will have a conformal and aligned growth, and thereby provide a high quality oxide for the transistor device subsequently formed. This sacrificial oxide will consume a portion of silicon 122 and will narrow the effective distance between the first and second gates. Because of this oxidation step and the gate oxidation step hereinafter described, the width W of silicon 122 can be formed to a minimum of approximately 20 nanometers (following oxidation), at which point oxidation stress will negatively impact the functioning of the device. Thus, for example, if the desired final silicon width W in the silicon 122 is to be 30 nanometers, the width W of the nitride 110 must be 50 nanometers to accommodate both the sacrificial and the gate oxide; for an initial width W of 70 nanometers, the second nitride 155 will have to be larger than 80 nanometers; for a width of 120 nanometers, the second nitride 155 will have to be larger than 170 nanometers. It should be understood that the definition of width W limits the channel length (in the Y–Y' direction) required in order to fully deplete the channel. In addition, buried oxide 104 must be thick enough to withstand subsequent oxide removals in the channel 120.

FIGS. 5A–5C show the device following the sacrificial oxide cleaning step. Subsequent to the oxide cleaning step, a gate oxide will be thermally grown in the trench along the silicon walls 120a,120b. While conformal oxide formation processes may be used to form gate oxide 130, thermal oxidation generally provides better gate oxides than deposited oxide processes. Gate oxide 130 can be grown by immersing the substrate 100 as shown in FIGS. 5A–5C in an oxygen ambient and heating the substrate for a period of approximately two minutes to grow the gate oxide to a thickness of approximately 1.2–1.7 nanometers. It should be recognized that the thickness of the gate oxide will depend upon the dimensions of the double gate transistor being formed, and particularly the width W of the trench. Alternatively, a nitrided oxide can be used for layer 130, formed by immersing the substrate in a nitrogen and oxygen ambient.

As further shown in FIGS. 6A–6C, following formation of the gate oxide 130, the trench is back-filled with a deposited polysilicon 140. The process of depositing polysilicon 140 to fill the trench and subsequently heating polysilicon will result in an oxide layer 145 covering polysilicon 140. As discussed further below, polysilicon 140 will serve as the channel region and source and drain regions for the double-gate transistor of the present invention.

Following the polysilicon fill step, as shown in FIGS. 7A–7C, a second nitride layer 155 is deposited on the surface of the device wafer 102 to cover the trench area and the polysilicon in the trench.

As shown in FIGS. 7A–7C, a second nitride layer 155 is deposited and formed to a perpendicular strip (relative to the first nitride layer) as shown in FIG. 7A. Nitride 155 may be formed in accordance with the previously-discussed deposition and etch method, or any alternative method suitable for forming the nitride 155 in a pattern as shown in FIGS. 7A–7C.

For example, a first nitride layer 110 has a thickness of approximately 50–190 nanometers, while a second nitride layer 155 has a thickness of approximately 25–95 nanometers.

Figure 8B:
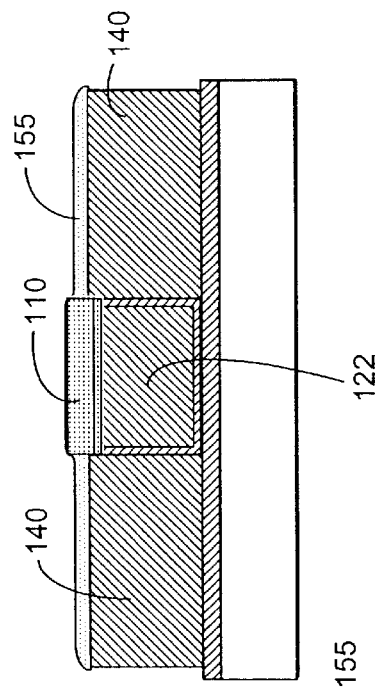
Figure 8C:
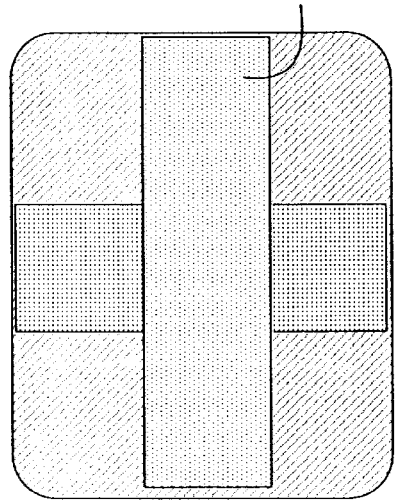

As shown in FIGS. 8A–8C, subsequent to the deposition of the second nitride layer 155, polysilicon regions not underlying the first or second nitride are etched away to isolate the double transistor structure of the present invention. This leaves polysilicon region 140 remaining in the trench surrounded by gate oxide 120a and 120b and a first 102a and second 102b regions of device wafer 102 which will form the self-aligned double gates of the device of the present invention.

Figure 9A:
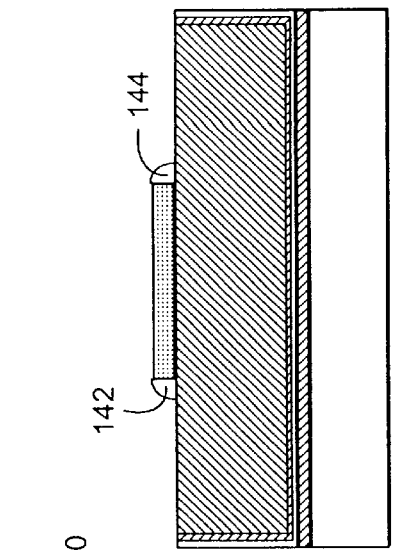

As shown in FIG. 9A, a portion of the first nitride layer 110a remains over what will become the channel region of the device of the present invention. At this point, in one embodiment, nitride spacers 142,144 may optimally be provided. In accordance with conventional techniques, a nitride layer may be deposited and etched to form spacers 142,144 prior to the source/drain implant illustrated in FIG. 9C.

Figure 9B:
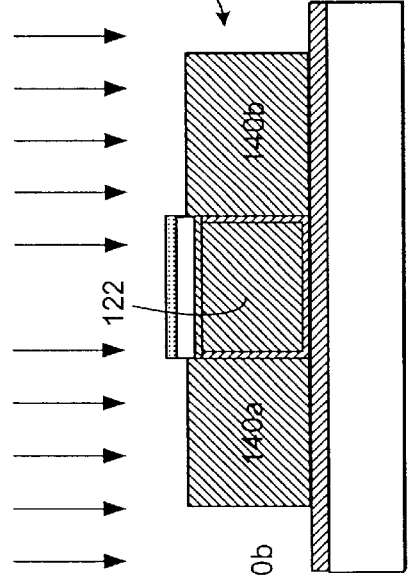
Figure 9C:
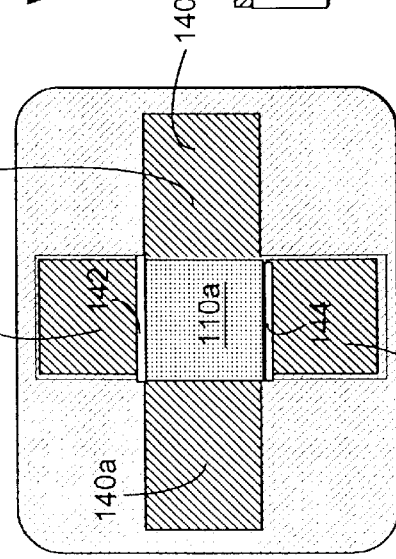

As shown in FIG. 9B, a source/drain/gate impurity implant is then performed to form the source and drain regions of the device of the present invention. The implant is such that the nitride 150 covering the channel area prevents implantation of the impurity into the channel region. Depending on the device size and strength of the impurity implant, the nitride 110 may be supplanted by an additional layer of oxide formed between nitride 110 and second nitride 155.

For an N-channel device, arsenic or phosphorous may be deposited to a concentration of approximately $2-4\times10^{15}/cm^3$ at energies of approximately 15–20 KeV (arsenic) or 7–10 KeV (phosphorous). For a P-channel device, boron may be implanted into a concentration of $2-3\times10^{15}/cm^3$ at energies of approximately 1.5–2.5 KeV. Zero degree tilt implants are used for these embodiments. The implants are then subsequently annealed in a rapid thermal anneal for approximately 5–10 minutes at a temperature of 1000–1025° C.

Finally, as shown in FIGS. 10A–C, a TEOS oxide may be deposited into the area 160 which has been etched away by the polysilicon etch described with respect to FIG. 8 and polished back to the nitride layer 150. The resulting device has gate impurity which is the same species as the source and drain.

It should be recognized that it is possible to fabricate the device so as to have an asymmetric work function (one gate with an N+ doping, the other gate with a P+ doping). One manner of forming asymmetric gates is to in-situ dope the device wafer with, for example, a P+ dopant, and then counter dope only one gate using a mask layer over area 102 or 102b.

Yet another embodiment of the invention is shown in FIG. 11. The device in FIG. 11 has a gate on three sides of the silicon island 140 which forms the channel of the device shown in FIGS. 2–10 and in FIGS. 11, 12–16. The device in FIG. 11 is processed in accordance with the method described below, which varies from the first embodiment in that, instead of depositing a second nitride layer, a gate mask is use to form the gate regions as follows.

This process for fabricating the device of FIG. 11 is shown in FIGS. 12A–C to FIGS. 16A–C. The device in FIG. 12A–C represents the device processed up to the point shown in FIG. 3A–C (following the device layer etch of FIG. 3A–C), but with the exposed (trench) areas filled with 210. TEOS 210 may be deposited in accordance with well-known techniques such that an upper surface of the TEOS layer reaches the upper surface of nitride 110.

Next, as shown in FIGS. 13A–13C, a gate photoresist 220 mask is deposited over the surface of the structure. Photoresist 220 may be any positive or negative reacting photoresist layer. Following deposition, as shown in FIGS. 14A–14C, an opening 230 in the photoresist is made of a shape corresponding to that of the second nitride layer shown in the previous embodiment. Processing of the photoresist layer to form opening 230 may be performed in accordance with well-known techniques depending on the type of photoresist layer used.

Next, as shown in FIGS. 15A–15C, a directional etch of the TEOS 210 and the first nitride layer opens two vias 240,245 in the substrate, as well as removing the first nitride over the polysilicon 122, exposing the underlying silicon 122. Following via formation, a gate oxide 242 may be grown by immersing the structure in an oxygen-containing atmosphere for two minutes. Following gate oxide growth, a polysilicon fill 250 forms the three-sided gate region 200 out of silicon overlying the silicon island 122. The polysilicon deposition may be in-situ doped with a desired impurity concentration to form the three sided gate structure 200 surrounding island 122.

In one embodiment, where a plurality of transistors are formed on the substrate, all n+ type gates are formed together, and p+ type gates are formed together. First, a p+ device gate mask (such as mask 220) is applied and all vias (both 240 and 245) for p+ gate devices are opened using an etch as described above. The p+ device gate mask is then removed. Next, gate oxide (242) is formed in all p+ gate devices and in-situ doped p+ polysilicon (200) is deposited, followed by a chemical mechanical polish of the polysilicon to remove excess polysilicon from the surface of region 200. Next, an n+ gate mask (220) and etch are used to open vias (240,245) for all n+ gate devices, the n+ device gate mask is removed, gate oxide (242) for the n+ gate devices is formed, and in-situ doped n+ type polysilicon is deposited, followed by a polishing step of the n+ type polysilicon to remove excess polysilicon from the surface of region 200. Alternatively, a direct implant and diffusion of a desired impurity may be used in each case. Next, an implantation of impurities, as set forth above with respect to the first embodiment, may be made to complete the source and drain regions.

In another embodiment, if in-situ doped polysilicon is used, the channel area may be opened twice for each device, as opposed to once. First, to form a p-channel device, an etch to open a first side (for example, via 240) may be opened (using a first mask layer 220); a first gate oxide grown, and a first deposition of in-situ p+ impurity doped polysilicon deposited in via 240. This polysilicon is then etched back. Next, a second via (for example, via 245) may be formed and a second gate oxide grown (which will oxidize the p+ doped polysilicon to prevent counter doping), followed by a deposition of an n+ impurity doped polysilicon. This n+ polysilicon is then polished back. The center gate region may be opened with either via 240 or 245.

The many features and advantages of the present invention will be apparent to one of average skill in the art. The invention forms both gates of a double gate transistor in the same plane as the silicon substrate. Both gates are fully self-aligned. The channel area can be made to a very thin 20-nanometer thickness by trench oxidation prior to the trench fill. In contrast, the vertically-aligned double-gate transistor has to obtain a very thin silicon layer by selective epitaxial silicon growth with a lack of thickness control. The thickness of the initial silicon island determines the minimum device width. For larger widths, a device has to be divided into multiple fingers. All such features and advantages are intended to be within the scope of the invention as defined herein by the attached claims.

What is claimed is:

1. A self-aligned transistor, comprising:
a first silicon portion on an isolation layer, the silicon portion having formed therein a source region and a drain region separated by a channel region, and having a first side and a second side and a top portion;
a gate oxide surrounding the channel on said first side, second side and top portion; and
a first, a second and a third silicon gate regions surrounding the first silicon portion about the first side, second side and top portion and the channel region.

2. The transistor of claim 1 wherein said first silicon portion includes an N+ source and drain region and a P-type channel region.

3. The transistor of claim 2 wherein said first portion is formed of contiguous deposited polysilicon.

4. The transistor of claim 3 wherein said second portion is formed of contiguous deposited polysilicon.

5. The transistor of claim 3 wherein said first gate, second gate, and third gate have an N+ dopant concentration matching the source and drain regions.

6. The transistor of claim 3 wherein said first gate region has an N+ doping and the second gate region has a P+ doping.

7. The transistor of claim 1 wherein said isolation layer comprises a buried oxide region of a silicon-on-insulator substrate.

8. The transistor of claim 7 wherein said first silicon portion, first gate, and second gate are formed in a contiguous horizontal plane in said silicon-on-insulator substrate.

9. The transistor of claim 1 wherein said first silicon portion has a width in a range between 20 nanometers and 150 nanometers.

10. The transistor of claim 1 wherein a gate oxide separates said first and second silicon portions.

11. The transistor of claim 1 wherein said gate oxide has a thickness of between 1.2–1.7 nanometers.

12. The transistor of claim 1 wherein the first and second polysilicon regions are surrounded by a conformal oxide.

* * * * *